United States Patent
Lee et al.

(10) Patent No.: US 8,928,341 B2
(45) Date of Patent: Jan. 6, 2015

(54) APPARATUS AND METHOD FOR AUTOMATED TESTING OF DEVICE UNDER TEST

(71) Applicant: Samsung Electronics Co. Ltd., Suwon-si (KR)

(72) Inventors: Han-Awl Lee, Seoul (KR); Jae-Kyu Lee, Suwon-si (KR); Woong-Hae Choi, Uijeongbu-si (KR); Byoung-Hee Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 177 days.

(21) Appl. No.: 13/737,286

(22) Filed: Jan. 9, 2013

(65) Prior Publication Data

US 2013/0328581 A1  Dec. 12, 2013

(30) Foreign Application Priority Data

Jun. 8, 2012  (KR) .................. 10-2012-0061826

(51) Int. Cl.
  *G01R 31/00* (2006.01)
  *G01R 31/319* (2006.01)
(52) U.S. Cl.
  CPC ........ *G01R 31/31924* (2013.01); *G01R 31/001* (2013.01)
  USPC ......... 324/750.01; 324/537; 324/601; 381/58
(58) Field of Classification Search
  CPC . G01R 31/001; G01R 31/31701; G01R 31/28

USPC ..................................................... 324/750.01
See application file for complete search history.

(56) References Cited

U.S. PATENT DOCUMENTS

| | | | |
|---|---|---|---|
| 7,633,735 B2 | 12/2009 | Urakawa | |
| 8,278,936 B2 * | 10/2012 | Grund | 324/537 |
| 2002/0050518 A1 * | 5/2002 | Roustaei | 235/454 |
| 2005/0137838 A1 * | 6/2005 | Medlyn | 703/13 |
| 2007/0061096 A1 * | 3/2007 | Mok | 702/118 |
| 2009/0027063 A1 * | 1/2009 | Scholz et al. | 324/601 |
| 2009/0074154 A1 * | 3/2009 | Lin et al. | 379/27.01 |
| 2009/0116656 A1 * | 5/2009 | Lee et al. | 381/59 |
| 2009/0134880 A1 * | 5/2009 | Grund | 324/537 |
| 2012/0153962 A1 * | 6/2012 | Finch et al. | 324/456 |
| 2013/0002273 A1 * | 1/2013 | Min et al. | 324/750.01 |
| 2013/0106434 A1 * | 5/2013 | Chung et al. | 324/612 |
| 2013/0108065 A1 * | 5/2013 | Mullins et al. | 381/58 |
| 2013/0278539 A1 * | 10/2013 | Valentine et al. | 345/174 |

FOREIGN PATENT DOCUMENTS

KR  10-2009-0034305 A  4/2009

* cited by examiner

*Primary Examiner* — Benjamin M Baldridge
(74) *Attorney, Agent, or Firm* — Jefferson IP Law, LLP

(57) ABSTRACT

An apparatus and a method for automated testing of electrostatic discharge of a Device Under Test (DUT) are provided. In the apparatus and the method, an electrostatic pulse is applied to the DUT, a malfunction type is detected from the DUT, and a control command is transmitted to the DUT to return a test mode of the DUT to a normal mode according to the detected malfunction type.

18 Claims, 9 Drawing Sheets

APPARATUS AND METHOD FOR AUTOMATED TESTING OF DEVICE UNDER TEST

PRIORITY

This application claims priority under 35 U.S.C. §119(a) to a Korean Patent Application filed on Jun. 8, 2012 in the Korean Intellectual Property Office and assigned Serial No. 10-2012-0061826, the entire disclosure of which are incorporated herein by reference.

BACKGROUND OF THE INVENTION

1. Field of the Invention

The present invention relates to an apparatus and method for testing a Device Under Test (DUT). More particularly, the present invention relates to an apparatus and method for automatically testing the performance of a DUT.

2. Description of the Related Art

A system that tests the performance of a DUT such as, for example, a mobile communication terminal, generally includes measuring equipment, a DUT, and a test device loaded with a test program that tests the DUT by controlling the DUT.

Testing the Electrostatic Discharge (ESD) of a DUT among performance characteristics of the DUT includes preparing an ESD prevention measure for an electronic product and testing the ESD prevention measure under a predetermined condition. The ESD test aims to prevent ESD-induced malfunctions of electronic products that a user may face in a real environment.

During an ESD test, a DUT malfunction is detected by applying high-voltage electrostatic pulses directly to a DUT using an ESD gun. For example, if the DUT is a mobile communication terminal like a portable phone, an operation of applying electrostatic pulses to a predetermined area of the mobile communication terminal using an ESD gun is repeated. As the electrostatic pulses may cause a malfunction of the mobile communication terminal, the testing device detects such a malfunction as an abnormal display change or sound change of the mobile communication terminal using a MICrophone (MIC) sensor and a light sensor.

As described above, a malfunction of a DUT like a mobile communication terminal such as an abnormal display change or sound change is just detected during an EST test of the DUT. However, there may be many other malfunction types other than a display or sound change during the ESD test. Accordingly, there exists a need for classifying malfunction types generated during an ESD test of a DUT and evaluating the test results. Moreover, to continue the ESD test of the DUT undergoing a malfunction, a user should reboot the DUT directly to place the DUT in a normal state. The manual user input required each time increases user inconvenience. Therefore, a method for transitioning the DUT to the normal state without a user input is also required.

Therefore, a need exists for a system and method for an automated test apparatus and method for accurately detecting a malfunction of a DUT during ESD testing of the DUT.

The above information is presented as background information only to assist with an understanding of the present disclosure. No determination has been made, and no assertion is made, as to whether any of the above might be applicable as prior art with regard to the present invention.

SUMMARY OF THE INVENTION

Aspects of present invention are to address at least the above-mentioned problems and/or disadvantages and to provide at least the advantages described below. Accordingly, an aspect of present invention is to provide an automated test apparatus and method for accurately detecting a malfunction of a DUT during ESD testing of the DUT.

Another aspect of the present invention is to provide an automated test apparatus and method for automatically transitioning a DUT to a normal state after a malfunction of the DUT is detected, during ESD testing of the DUT.

In accordance with an exemplary embodiment of the present invention, an apparatus for automated testing of a DUT is provided. The apparatus includes a light sensor that detects a display state change in the DUT, a microphone sensor that detects a change in the level of a signal output from a speaker of the DUT, a current sensor that detects a current state of the DUT, a serial terminal that connects communication to the DUT, and a controller transmits a control command to the DUT through the serial terminal to return a test mode of the DUT to a normal mode according to a malfunction type that is detected by at least one of the light sensor, the microphone sensor, the current sensor, and the serial terminal when an electrostatic pulse is applied to the DUT.

In accordance with another aspect of the present invention, a method for automated testing of electrostatic discharge of a DUT in an automated test equipment is provided. The method includes applying an electrostatic pulse to the DUT, detecting a malfunction type from the DUT, and transmitting a control command to the DUT to return a test mode of the DUT to a normal mode according to the detected malfunction type.

In accordance with an exemplary embodiment of the present invention, a non-transient computer readable storage medium is provided. The storage medium stores instructions that when executed causes at least one processor to perform a method for automated testing of electrostatic discharge of a Device Under Test (DUT) in an automated test equipment. The method includes applying an electrostatic pulse to the DUT; detecting a malfunction type from the DUT; and transmitting a control command to the DUT to return a test mode of the DUT to a normal mode according to the detected malfunction type.

Other aspects, advantages, and salient features of the invention will become apparent to those skilled in the art from the following detailed description, which, taken in conjunction with the annexed drawings, discloses exemplary embodiments of the invention.

BRIEF DESCRIPTION OF THE DRAWINGS

The above and other objects, features, and advantages of certain exemplary embodiments of the present invention will be more apparent from the following description taken in conjunction with the accompanying drawings, in which.

Throughout the drawings, like reference numerals will be understood to refer to like parts, components, and structures.

DETAILED DESCRIPTION OF EMBODIMENTS OF THE INVENTION

Figure 1:
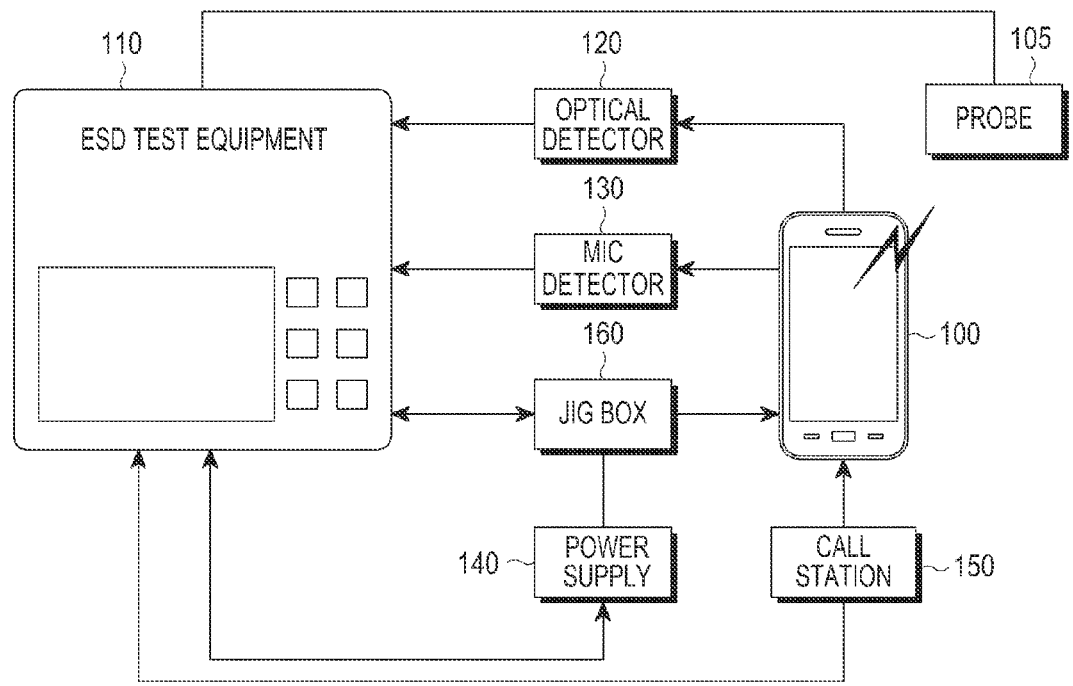
FIG. 1 is a block diagram of an unattended automated test system according to an exemplary embodiment of the present invention.

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. In addition, descriptions of well-known functions and constructions may be omitted for clarity and conciseness.

The terms and words used in the following description and claims are not limited to the bibliographical meanings, but, are merely used by the inventor to enable a clear and consistent understanding of the invention. Accordingly, it should be apparent to those skilled in the art that the following description of exemplary embodiments of the present invention is provided for illustration purpose only and not for the purpose of limiting the invention as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Reference will be made to exemplary embodiments of the present invention with reference to the attached drawings. Like reference numerals denote the same parts in the drawings. A detailed description of a generally known function and structure of exemplary embodiments of the present invention will be avoided lest it should obscure the subject matter of the present invention.

Exemplary embodiments of the present invention provide a method for automatically testing the performance of a Device Under Test (DUT) in an unattended automated test system. For this purpose, exemplary embodiments of the present invention involve determining whether a test result is a success or failure when electrostatic pulses are applied to the DUT to test the Electrostatic Discharge (ESD) of the DUT, detecting at least one malfunction type, if the test result is a failure, and transitioning the DUT to a normal state by controlling a function for the DUT using a predetermined algorithm according to the malfunction type. Therefore, various malfunction types can be classified and the DUT can be controlled to be transitioned to the normal state according to a classified malfunction type during ESD testing, thereby enabling unattended automated testing.

FIG. 1 is a block diagram of an unattended automated test system according to an exemplary embodiment of the present invention.

Referring to FIG. 1, the structure and operation of an unattended automated test system having the above-described function will be described below.

The unattended automated test system largely includes a DUT 100 and automated test equipment in which an execution program for performing an automated DUT test by controlling the DUT 100.

In accordance with an exemplary embodiment of the present invention, the automated test equipment is ESD test equipment 110 for testing the ESD of the DUT 100 as illustrated in FIG. 1. The ESD test equipment 110 applies electrostatic pulses to the DUT 100, for example, a mobile communication terminal 100 by controlling a probe 105. The electrostatic pulses projected to the mobile communication terminal 100 through the probe 105 are, for example, an H-field, an E-field, and the like. The ESD test equipment 110 is connected to at least one sensor in order to detect a malfunction type for each specific chip of the mobile communication terminal 100 during an ESD test.

To detect a malfunction type for a specific chip of the mobile communication terminal 100, electrostatic pulses, for example, an H-field is applied to the specific chip. Preferably, an ESD test is performed in an MP3 mode to test a chip such as an Application Processor (AP), a CODEC, a Power Management IC (PMIC), and the like. In addition, an ESD test is performed preferably in a camera mode for a chip such as an Image Signal Processor (ISP). For a call-related Communication Processor (CP), a Radio Frequency (RF) block, and the like, an ESD test is performed preferably in a call mode. In the illustrated case of FIG. 1, to detect malfunction types in the respective MP3 mode, camera mode, and call mode of the mobile communication terminal 100, the ESD test equipment 110 is connected to an optical detector 120, a MICrophone (MIC) detector 130, a power supply 140, a call station 150, and a jig box 160.

Although FIG. 1 shows only the optical detector 120, the MIC detector 130, the power supply 140, the call station 150, and the jig box 160 to respectively detect a display change, a sound change, a current state, a communication state, and a reset state, other sensors may be added to detect malfunctions of the mobile communication terminal 100 other than the above-described malfunction types. The ESD test equipment 110 may further include a memory for storing detected malfunction types as classified and a user interface for notifying a classified malfunction type and a test result so that a user may evaluate the malfunction type. Herein, the ESD test equipment 110 may be configured with a master Personal Computer (PC) or the like. A malfunction type detection operation of the ESD test equipment 110 according to the present invention will be described later in greater detail with reference to FIG. 2.

The optical detector 120 detects a display change of the mobile communication terminal 100 and outputs an optical monitoring result to the ESD test equipment 110.

The MIC detector 130 monitors the level of sound output from a speaker of the mobile communication terminal 100. This MIC detector 130 detects a change in a signal output from the speaker and notifies the ESD test equipment 110 of the detected change.

The power supply 140 receives a power on/off command from the ESD test equipment 110 and supplies or cuts off power to the mobile communication terminal 100 in response to the power on/off command. If power supply resumes, the mobile communication terminal 100 is reset and thus rebooted. The ESD test equipment 110 detects a change in the current state of the mobile communication terminal 100 based on a change in current output from the power supply 140. For example, the ESD test equipment 110 detects a current change in the mobile communication terminal 100 during an ESD test.

The call station 150 is a device for connecting a call to the DUT 100. The call station 150 serves as a base station to detect a call connection state of the mobile communication terminal 100. Upon receipt of a call connection command from the ESD test equipment 110, the call station 150 monitors network registration and call connection of the mobile communication terminal 100.

The jig box 160 serially connects the ESD test equipment 110 to the mobile communication terminal 100. For example, the ESD test equipment 110 may be connected serially to the mobile communication terminal 100 via a Universal Serial Bus (USB), a Local Area Network (LAN), or RS-232. The jig box 160 establishes a connection path in which a log feedback is received from the mobile communication terminal 100 in real time. The jig box 160 transfers a command to control an operation of the mobile communication terminal 100 from the ESD test equipment 110.

Now a description will be given of a detailed structure of the unattended automated test system for detecting a malfunction type with reference to FIG. 2.

Figure 2:
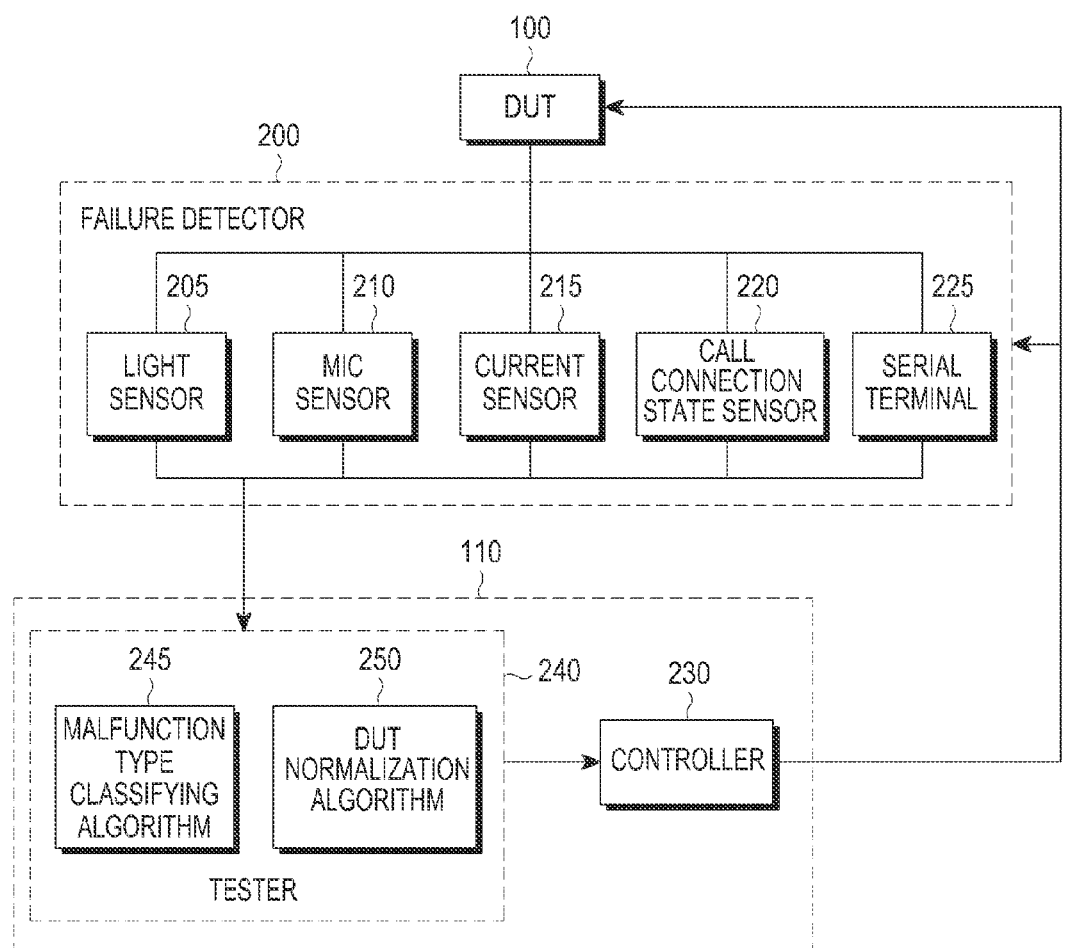
FIG. 2 is an internal block diagram of an unattended automated test system according to an exemplary embodiment of the present invention.

FIG. 2 is an internal block diagram of an unattended automated test system according to an exemplary embodiment of the present invention.

Referring to FIG. 2, the initial state of the DUT 100 should be normal, for ESD testing of the DUT 100. For example, the DUT 100 should be normally connected to the ESD test equipment 110 and the display light intensity, speaker state, and current state of the DUT 100 should satisfy predetermined conditions. In accordance with an exemplary embodiment of the present invention, a probe is used to ensure continuity and reproducibility of a test, instead of an ESD gun that may damage the DUT 100.

When electrostatic pulses are applied to the DUT 100 using the probe 105, the ESD test equipment 110 receives a detection result from a failure detector 200 connected to the ESD test equipment 110. The failure detector 200 includes a light sensor 205, a MIC sensor 210, a current sensor 215, a call connection state sensor 220, and a serial terminal 225. As an example, the light sensor 205, the MIC sensor 210, the current sensor 215, the call connection state sensor 220, and the serial terminal 225 may correspond to the optical detector 120, the MIC detector 130, the power supply 140, the call station 150, and the jig box 150 of FIG. 1, respectively.

The light sensor 205 detects a change in the display state of the DUT 100 prior to ESD testing. For example, the light sensor 205 measures the intensity of light. As an example, the light sensor 205 measures the level of light output from a display and detects a change in the display light intensity, caused by an electrostatic pulse-induced malfunction. For example, if the measured light level does not satisfy a predetermined light level, the light sensor 205 outputs a display failure result indicating that the display state is abnormal. If the display failure result is a 1-bit signal, a signal set to '1' is output.

The MIC sensor 210 detects a change in the level of a signal output from a speaker of the DUT 100. More specifically, the MIC sensor 210 receives a sound in a specific frequency from the speaker, measures the level of the received sound, and thus detects a speaker state caused by an electrostatic pulse-induced malfunction based on the sound level measurement. For example, if the level of a signal output from the speaker is different from a predetermined value, the MIC sensor 210 outputs a 1-bit signal set to '1' indicating that the speaker state is abnormal.

The current sensor 215 supplies power to the DUT 100 and detects a normal current state and a current state caused by an electrostatic pulse-induced malfunction of the DUT 100. Specifically, the normal current state is determined by determining whether the highest and lowest current levels of an output pulse signal satisfy preset highest and lowest current thresholds and determining whether the output pulse signal continuously crosses a predetermined center line between the preset highest and lowest current thresholds. If the conditions set for the normal current state are not satisfied, the current sensor 215 determines a malfunction-caused current state.

For example, the light sensor 205 and the MIC sensor 210 do not detect a phenomenon such as lock-up that may be caused by electrostatic pulses in the DUT 100. To eliminate the lock-up of the DUT 100, the current sensor 215 determines whether the current state of the DUT 100 has been changed in accordance with the exemplary embodiment of the present invention. If the current state detected by the current sensor 215 does not satisfy a predetermined current state condition, the current sensor 215 outputs a 1-bit signal set to '1', considering that lock-up has been generated.

To detect a malfunction in the call mode of the DUT 100, the call connection state sensor 220 monitors network registration and call connection, when electrostatic pulses are applied to the DUT 100. For example, the call connection state sensor 220 notifies the ESD test equipment 110 using a 1-bit signal set to '0' or '1' whether a call has been connected or not to the DUT 100. The call connection state sensor 220 also notifies the ESD test equipment 110 by '0' or '1' whether the DUT 100 has registered to a network.

The serial terminal 225 transmits a command to control the DUT 100 for automation of the ESD test equipment 110 under the control of the ESD test equipment 110 and receives a response to the command.

Meanwhile, the ESD test equipment 110 largely includes a tester 240 and a controller 230. The tester 240 includes a malfunction type classifying algorithm 245 for identifying a malfunction according to a detection result received from the failure detector 200 and a DUT normalization algorithm 250 for returning the DUT 100 to a normal state according to a classified malfunction type.

The controller 230 classifies a malfunction type caused by electromagnetic pulses in a specific mode of the DUT 100 according to the malfunction type classifying algorithm 245, controls sensors, for example, the current sensor 215 and the call connection state sensor 220 to normalize a current test mode according to the classified malfunction type by the DUT normalization algorithm 250, and transmits a control command through the serial terminal 225 in order to control the DUT 100.

Exemplary embodiments of the present invention will be described below separately. An exemplary embodiment of the present invention provides a malfunction detection operation during an ESD test in an MP3 mode to test a chip like an AP, a CODEC, and a PMIC. Another exemplary embodiment of the present invention provides a malfunction detection operation during an ESD test in a camera mode to test a chip like an ISP. A further exemplary embodiment of the present invention provides a malfunction detection operation during an ESD test in a call mode to test a call-related chip.

Figure 3:
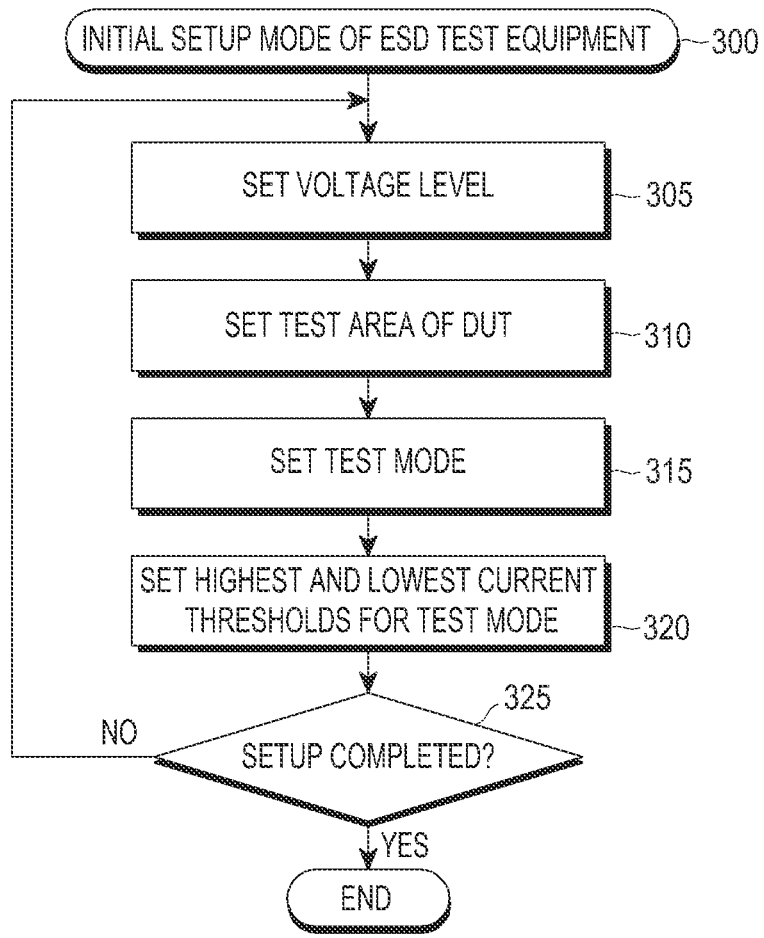
FIG. 3 is a flowchart illustrating an initial setup-mode operation of ESD test equipment according to an exemplary embodiment of the present invention.

To perform these ESD tests, a setup of the ESD test equipment is needed, as illustrated in FIG. 3.

FIG. 3 is a flowchart illustrating an initial setup-mode operation of ESD test equipment according to an exemplary embodiment of the present invention.

Referring to FIG. 3, after the ESD test equipment 110 is connected to the DUT 100, the ESD test equipment 110 is activated. Then a user can perform an initial setup by selecting setting items.

When an ESD test equipment initial setup mode is placed in step 300, the user sets a voltage level at which a voltage is to be applied in step 305. For example, the user may set the voltage level by selecting a highest level, a lowest level, and a level control step. The user sets a test area of the DUT 100 in step 310 and selects a test mode in step 315. For example, the user may select one of the MP3 mode, the camera mode, and the call mode as test modes. In step 320, highest and lowest current thresholds may be set to detect a malfunction in the selected test mode. As described above, the user may set a test mode, an ESD test area, a voltage level to be applied to the test area, highest and lowest current thresholds for malfunction detection in each test mode during initial setup of the ESD test equipment 110. In step 325, the ESD test equipment 110 determines whether setup is completed. If the setup is determined to be completed, the ESD test equipment 110 ends the setup mode operation. In contrast, if the setup is determined to not be completed, the ESD test equipment 110 returns to step 305.

An operation based on a malfunction type in the MP3 mode according to an exemplary embodiment of the present invention will be described with reference to FIGS. 4A and 4B.

Figure 4A:
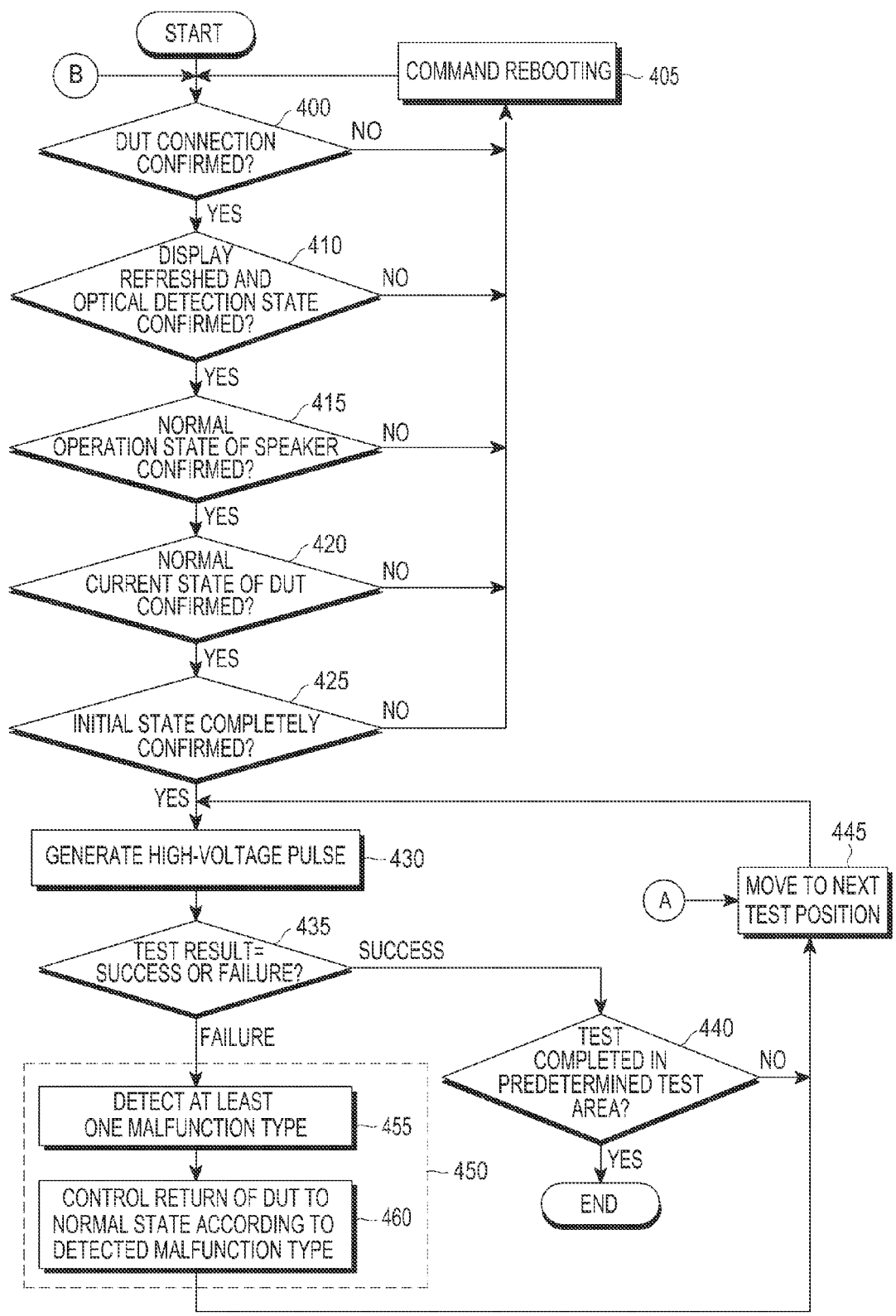
FIGS. 4A, 4B and 4C are flowcharts illustrating a control operation according to a malfunction type in an MP3 mode according to an exemplary embodiment of the present invention.
Figure 4B:
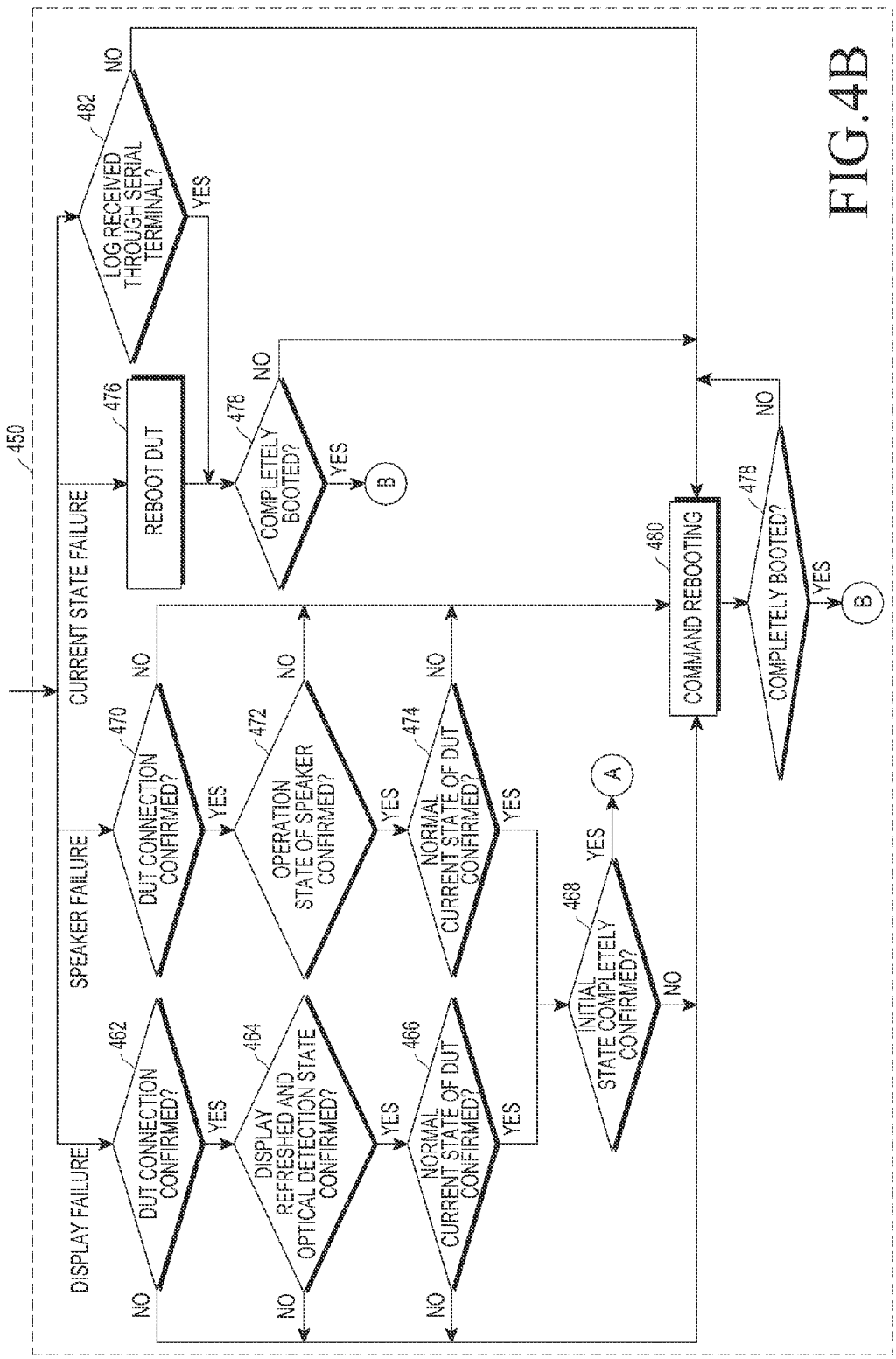
Figure 4C:
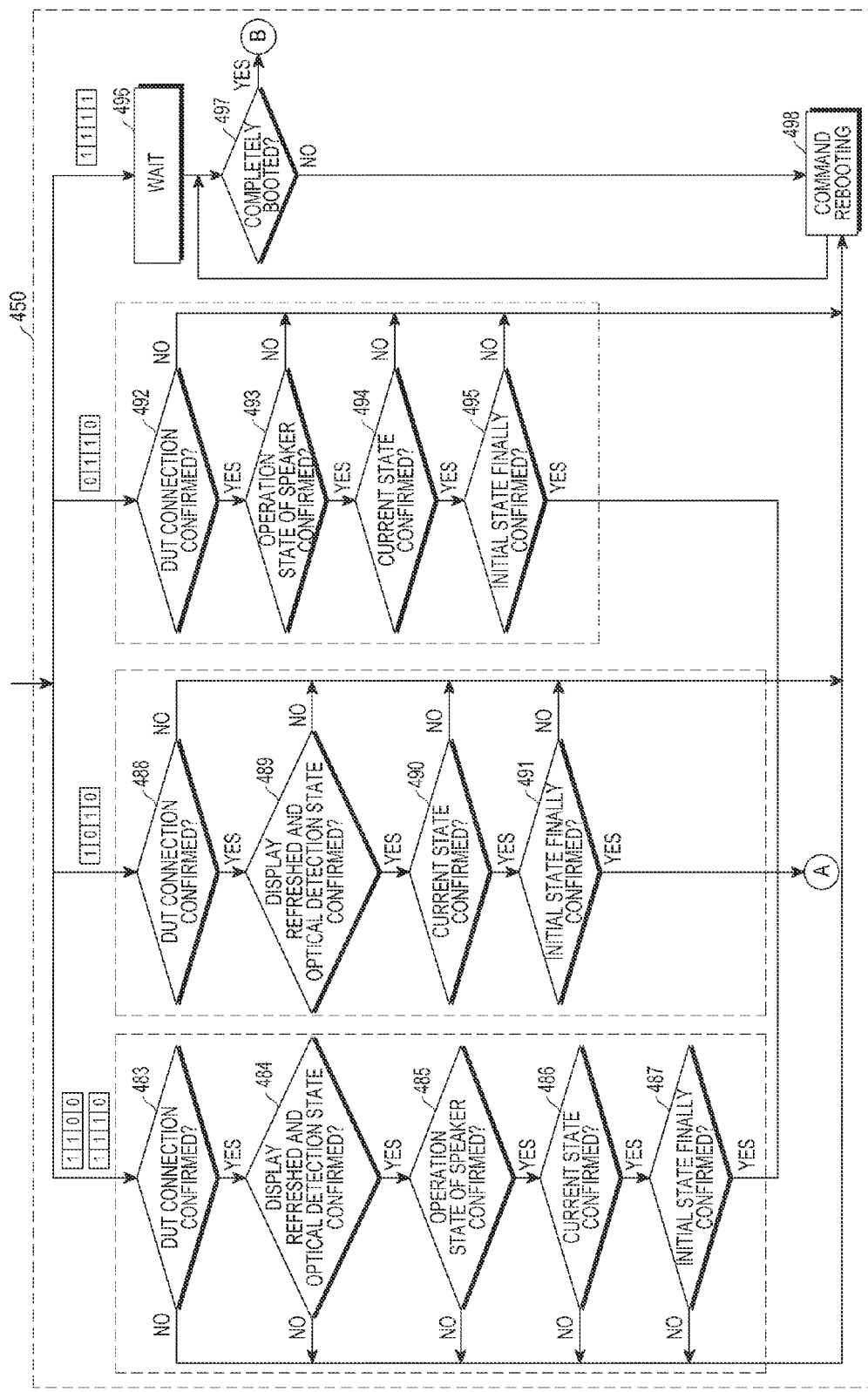

FIGS. 4A, 4B and 4C are flowcharts illustrating a control operation according to a malfunction type in an MP3 mode according to an exemplary embodiment of the present invention. As an example, FIG. 4B is a detailed flowchart illustrating steps 455 and 460 indicated by reference numeral 450 in FIG. 4A.

Before an ESD test, the initial state of the ESD test equipment 110 needs to be set to the MP3 mode. Accordingly, the ESD test equipment 110 is initially set up in steps 400 to 425.

The ESD test equipment 110 determines whether it has been connected to the DUT 100 in step 400. Specifically, the ESD test equipment 110 transmits an 'AT command' to the DUT 100 through the jig box 160. Upon receipt of an 'ok' message in response to the 'AT command' from the DUT 100, the ESD test equipment 110 determines that it has been connected to the DUT 100.

If the ESD test equipment 110 has not been connected to the DUT 100, for example, if the ESD test equipment 110 has not received an 'ok' message from the DUT 100 in step 400, then the ESD test equipment 110 proceeds to step 405. In step 405, the ESD test equipment 110 commands rebooting to the DUT 100 by transmitting a rebooting command to the DUT 100. Before transmitting the rebooting command to the DUT 100, the ESD test equipment 110 may transmit the 'AT command' to the DUT 100 repeatedly a predetermined number of times until receiving the 'ok' message.

In contrast, if confirming that the ESD test equipment 110 has been connected to the DUT 100, then the ESD test equipment 110 proceeds to step 410. In step 410, the ESD test equipment 110 refreshes the display of the DUT 100 and determines an optical detection state. Specifically, the ESD test equipment 110 refreshes the display by transmitting a display power-on command and then display power-off command to the DUT 100 and compares the level of light output from the display of the DUT 100 with a predetermined level through the optical detector 120. If the ESD test equipment 110 does not receive an 'ok' message in response to the refresh command from the DUT 100, the ESD test equipment 110 proceeds to step 405.

If the optical detection state of the DUT 100 is a normal state, for example, if the measured light level satisfies a predetermined light level after the display of the DUT 100 has been refreshed normally, the ESD test equipment proceeds to step 415. In step 415, the ESD test equipment 110 determines whether the speaker is in a normal operation state. Specifically, the ESD test equipment 110 detects the frequency level of a signal output from the speaker through the MIC detector 130. If the detected frequency level satisfies a predetermined frequency level, the ESD test equipment 110 determines that the speaker is in the normal operation state. If the detected frequency level is different from the predetermined frequency level, the ESD test equipment 110 goes to step 405.

If determining that the speaker is in the normal operation state in step 415, the ESD test equipment 110 proceeds to step 420. In step 420, the ESD test equipment 110 determines whether the DUT 100 is in a normal current state. Specifically, the ESD test equipment 110 determines whether the highest and lowest current levels of a pulse signal output from the power supply 140 satisfy predetermined highest and lowest current thresholds and determines whether the pulse signal continuously crosses a predetermined center line between the predetermined highest and lowest current thresholds.

If at least one of the two conditions is not satisfied, the ESD test equipment 110 goes to step 405. In contrast, if both conditions are satisfied, the ESD test equipment 110 determines that the DUT 100 is in the normal current state. If the ESD test equipment 110 determines that the DUT 100 is in the normal current state, then the ESD test equipment 110 proceeds to step 425. In step 425, the ESD test equipment 110 determines whether it has completely confirmed the initial state of the failure detector 200 prior to ESD testing. If any of steps 400 to 425 during the initial setup is not completed, the DUT 100 is rebooted. For rebooting the DUT 100, the power supply 140 is controlled to cut off power supply to the DUT 100.

Upon completion of confirming the initial state, the ESD test equipment 110 proceeds to step 430. In step 430, the ESD test equipment 110 places the probe 105 at an intended test position of the DUT 100 and generates electrostatic pulses. For example, the ESD test equipment generates an H-field through the probe 105 in step 430. In step 435, the ESD test equipment 110 determines whether the test result is a success or a failure. In other words, the ESD test equipment 110 determines whether a malfunction is detected during the ESD test. If the test result is a success, for example, if the components of the failure detector 200 have detected no malfunction, the ESD test equipment 110 proceeds to step 440. In step 440, the ESD test equipment 110 determines whether the predetermined test area has been completely tested. Once an initial ESD test program is executed, the user may set the test area.

Upon completion of testing the predetermined test area, the ESD test equipment 110 ends the ESD test of the DUT 100. In contrast, if the test is still running on the predetermined test area, the ESD test equipment proceeds to step 445. In step 445, the ESD test equipment 110 moves the probe 105 to the next test position of the DUT 100 and thereafter returns to step 430. Thus, the ESD test is repeated at the moved test position.

In contrast, if the test result of step 435 is a failure, for example, if a malfunction is detected in step 435, the ESD test equipment 110 proceeds to step 455. In step 455, the ESD test equipment 110 detects at least one malfunction type. Thereafter, the ESD test equipment 110 proceeds to step 460. In step 460, the ESD test equipment 110 controls a function for returning the DUT 100 to a normal state according to the detected malfunction type. For example, the ESD test equipment 110 controls on/off of the DUT 100 to return the DUT 100 to a normal MP3 mode. The control operation 450 for the DUT 100 according to the detected malfunction type will be described in more detail with reference to FIG. 4B.

Referring to FIG. 4B, when an ESD test starts in the MP3 mode, a malfunction such as display blackout, an abnormal light level, an abnormal speaker output level, lock-up of the DUT, and DUT reset may occur. Therefore, the light sensor 205, the MIC sensor 210, the current sensor 215, and the serial terminal 225 may detect failures caused by the malfunctions.

Upon receipt of a display failure result from the light sensor 205, the ESD test equipment 110 refreshes the display of the DUT 100 by transmitting an 'AT command' to the DUT 100 and determines whether the DUT 100 has returned to a normal state. Then the ESD test equipment 110 continues the ESD test. More specifically, the ESD test equipment 110 determines its connection to the DUT 100 in step 462, refreshes the display and determines an optical detection state in step 464, and determines whether the DUT 100 is a normal current state in step 466. The steps 462, 464, and 466 are performed in the same manner as steps 400, 410, and 420 of FIG. 4A and thus a detailed description of them will not be provided herein.

Because a display failure is caused by display blackout or a dropped light level as detected by the optical detector 205, the DUT 100 may return to a normal state simply by turning on and then turning off the display of the DUT 100. Therefore, the ESD test equipment 110 refreshes the display of the DUT 100 and determines an optical detection state in 464. Upon completion of checks in steps 462, 464, and 466, the ESD test equipment 110 determines whether the initial state has been completely confirmed in step 468. If the initial state is still being determined, the ESD test equipment 110 commands rebooting to the DUT 100 in step 480. In contrast, upon completed confirmation of the initial state, the ESD test equipment 110 goes to step 445 of FIG. 4A in order to move to the next test position and perform an ESD test at the moved test position.

If the MIC sensor 210 detects a sound failure indicating that the output level of the speaker is abnormal, the ESD test equipment ESD 110 determines its connection to the DUT 100 in step 470, determines the operation state of the speaker in step 472, and determines whether the DUT 100 is in a normal current state in step 474. Steps 470, 472, and 474 are performed in the same manner as steps 400, 415, and 420 of FIG. 4A and thus a detailed description of them will not be provided herein. Because the speaker can return to a normal state simply by turning on the speaker at the event of a speaker malfunction, the speaker is turned on and then its output level is determined in step 472. If the confirmation is not completed, for example, an 'ok' message is not received from the DUT 100 in steps 462, 464, 466, 470, 472, and 474, the ESD test equipment 110 commands rebooting to the DUT 100 in step 480. For rebooting the DUT 100, the power supply is turned off for a few seconds and then turned on.

Meanwhile, the current sensor 215 determines a current change. If a predetermined normal current state condition is not satisfied, the current sensor 215 detects a current state failure. The reason for sensing a change in the current state is to handle lock-up of the DUT 100 which is not detected by a display change or a sound change. To eliminate the lock-up of the DUT 100, the ESD test equipment 110 commands rebooting to the DUT 100 in step 476 and determines whether the DUT 100 has been completely booted in step 478. For example, the ESD test equipment 110 determines whether a 'booting completed" message has been received in response to the rebooting command through the serial terminal 225. Upon completion of booting of the DUT 100, the ESD test equipment 110 returns to step 400 of FIG. 4A. In contrast, if the DUT 100 has not been booted completely, for example, the 'booting completed' message has not been received, the ESD test equipment 110 commands rebooting to the DUT 100 in step 480.

If no failure is detected through the light sensor 205, the MIC sensor 210, and the current sensor 215, the ESD test equipment 110 determines whether a log has been received through the serial terminal 225 in step 482. When electrostatic pulses are applied to the DUT 100, the DUT 100 may be reset and thus rebooted. Once the DUT 100 is rebooted, the ESD test equipment 110 receives logs through the serial terminal 225. Upon receipt of successive logs through the serial terminal 225, the ESD test equipment 110 determines that the DUT 100 has been reset and rebooted and then determines whether the DUT 100 has been completely booted in step 478. Upon completed booting of the DUT 100, the ESD test equipment 110 returns to step 400 of FIG. 4A. In contrast, if the ESD test equipment 110 has received no log, this means that the DUT 100 may be in an off state. Thus, the ESD test equipment 110 commands rebooting to the DUT 100 in step 480. If the ESD test equipment 110 has not received a log through the serial terminal 225, the ESD test equipment 110 transmits an 'AT command' to the DUT 100 through the serial terminal 225. If the ESD test equipment 110 has not received an 'ok' message in response to the 'AT command', the ESD test equipment 110 may command rebooting to the DUT 100. Non-reception of the 'ok' message is equivalent to failure of connection to the DUT 100 or the off state of the DUT 100. Thus, the serial terminal 225 may notify of the failure by a 1-bit signal.

Although the above description has been given, taking as an example one of a display failure, a microphone failure, a current state failure, and a DUT reset as malfunctions detected by the light sensor 205, the MIC sensor 210, the current sensor 215, and the serial terminal 225, a plurality of malfunctions may occur simultaneously, like lock-up of the DUT simultaneous with display blackout.

In accordance with an exemplary embodiment of the present invention, a failure detection table for each mode is used, taking into account simultaneous occurrence of a plurality of malfunctions. This failure detection table may be stored in the memory of the ESD test equipment 110.

Table 1 below is an exemplary failure detection table for the MP3 mode. The ESD test equipment 110 returns the DUT 100 to a normal mode against any malfunction, referring to the failure detection table.

TABLE 1

Fail Detection Table

| Light sensor | MIC sensor | Current sensor | Serial terminal |
|---|---|---|---|
| 0/1 | 0/1 | 0/1 | 0/1 |

Table 1 is compared with a code output from the failure detector 200. As illustrated in Table 1, the light sensor 205 outputs '1' as a display failure and '0' as a display success. Likewise, the current sensor 215 outputs '0' if a measured current change value satisfies a predetermined current condition, and '1' if the measured current change value does not satisfy the predetermined current condition. The serial terminal 225 outputs '1' if the ESD test equipment 110 transmits an 'AT command' to the DUT 100 due to non-reception of a log from the DUT 100 through the serial terminal 225 and receives an 'ok' message in response to the 'AT command' through the serial terminal 225. When no log is received from the DUT 100 through the serial terminal 225, the serial terminal 225 also outputs '1'. If a log or an 'ok' message is received, the serial terminal 225 outputs '0'. For example, if the state of the DUT 100 is not confirmed through the serial terminal 225, the serial terminal 225 outputs '1' indicating a failure.

FIG. 4C illustrates the operation for controlling the DUT 100 according to a malfunction type detected in FIG. 3A, referring to Table 1.

Referring to FIG. 4C, if '1100' or '1110' is detected through the light sensor 205, the MIC sensor 210, the current sensor 215, and the serial terminal 225 of the failure detector 200, this means that the display and the speaker malfunction. In this case, an operation for returning the DUT 100 to a normal state in relation to the display and speaker malfunctions is performed, as in steps 483 to 487. Upon detection of failures through the light sensor 205 and the current sensor 215, for example, '1010', steps 488 to 491 are performed to return the display and the current state to normal states. Upon detection of a speaker malfunction and an abnormal current state, for example, '0110', steps 492 to 495 are performed. Upon detection of '1111', steps 496 and 497 are performed. Each step is the same as its counterpart in FIGS. 4A and 4B and thus it will not be described in detail herein to avoid redundancy.

Figure 5:
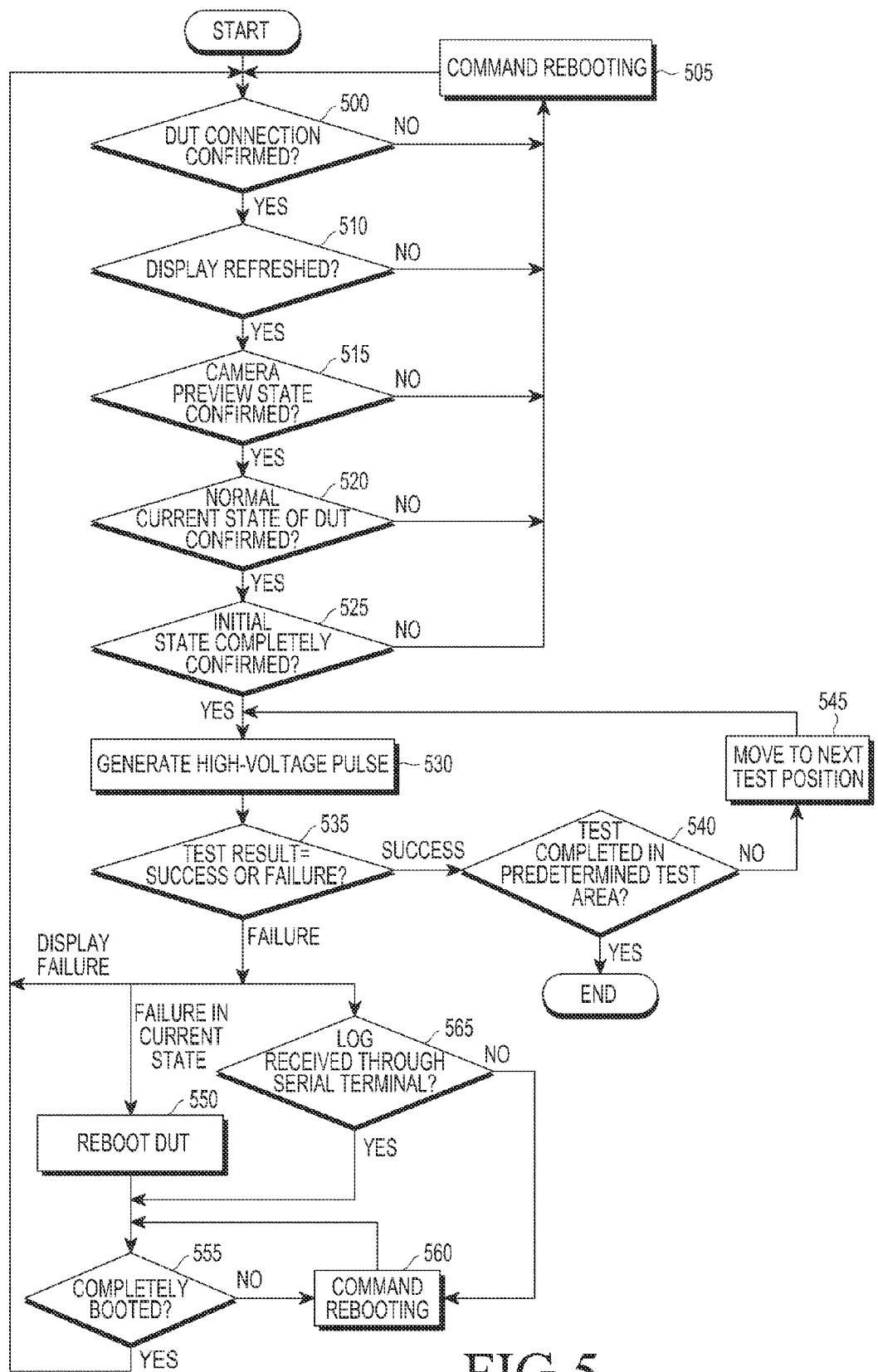
FIG. 5 is a flowchart illustrating a control operation according to a malfunction type in a camera mode according to another exemplary embodiment of the present invention.

FIG. 5 is a flowchart illustrating a control operation according to a malfunction type in a camera mode according to another exemplary embodiment of the present invention.

Referring to FIG. 5, an operation based on a malfunction type in the camera mode according to another exemplary embodiment of the present invention will be described below.

Referring to FIG. 5, steps 500 to 545 are performed in the same manner as steps 400 to 445 of FIG. 4A, except that step 515 corresponds to an initial setup of the camera mode, unlike step 415 of FIG. 4A and thus a camera preview state is confirmed in step 515. To determine whether the camera preview state has been confirmed, the ESD test equipment 110 commands the DUT 100 to enter the camera preview mode. Upon receipt of an 'ok' message in response to the command, the ESD test equipment 110 determines that the DUT 100 has entered the camera preview mode. Subsequently, the ESD test equipment 110 determines through the light sensor 205 whether the display level of the DUT 100 is normal in the camera preview mode. If determining that the display level is normal in the camera preview mode, the ESD test equipment 110 ends confirmation of the camera preview state.

As in the MP3 mode, the ESD test equipment 110 may return the DUT 100 to normal mode in regards to any malfunction, referring to a failure detection table for the camera mode, like Table 2.

TABLE 2

| Fail Detection Table | | |
| --- | --- | --- |
| Light sensor | Current sensor | Serial terminal |
| 0/1 | 0/1 | 0/1 |

Referring to Table 2, upon detection of '100' or '110' through the light sensor 205, the current sensor 215, and the serial terminal 225 of the failure detector 200 in step 535, the ESD test equipment 110 performs steps 500 to 525. Upon detection of '010', the ESD test equipment 110 reboots the DUT 100 in step 550. Upon completion of booting the DUT 100 in step 555, the ESD test equipment 110 returns to step 500. In contrast, if the DUT 100 is still being booted in step 555, the ESD test equipment 110 commands rebooting to the DUT 100 in step 555 and determines whether the DUT 100 has been completely booted in step 555. Upon detection of '111', the ESD test equipment 110 waits a predetermined time and then determines whether a log has been received through the serial terminal 225 in step 565. If a log has not been received, the ESD test equipment 110 commands rebooting to the DUT 100 in step 560. Upon receipt of a log, the ESD test equipment 110 determines that the DUT 100 is being rebooted and then determines whether the booting of the DUT 100 has been completed in step 555. Upon completion of the booting, the ESD test equipment 110 returns to the initial setup step of the DUT 100.

Figure 6A:
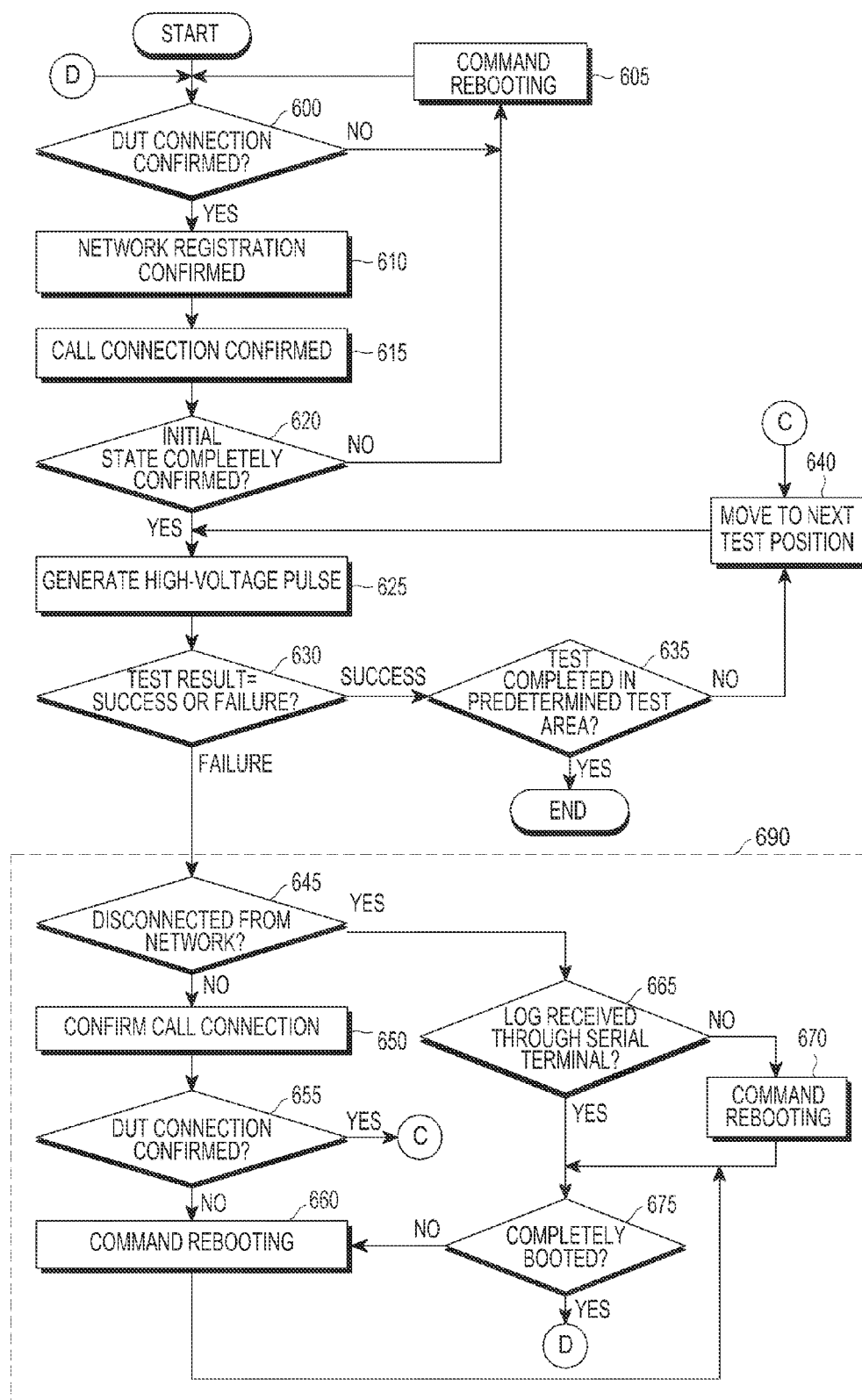
FIGS. 6A and 6B are flowcharts illustrating a control operation according to a malfunction type in a call mode according to a further exemplary embodiment of the present invention.
Figure 6B:
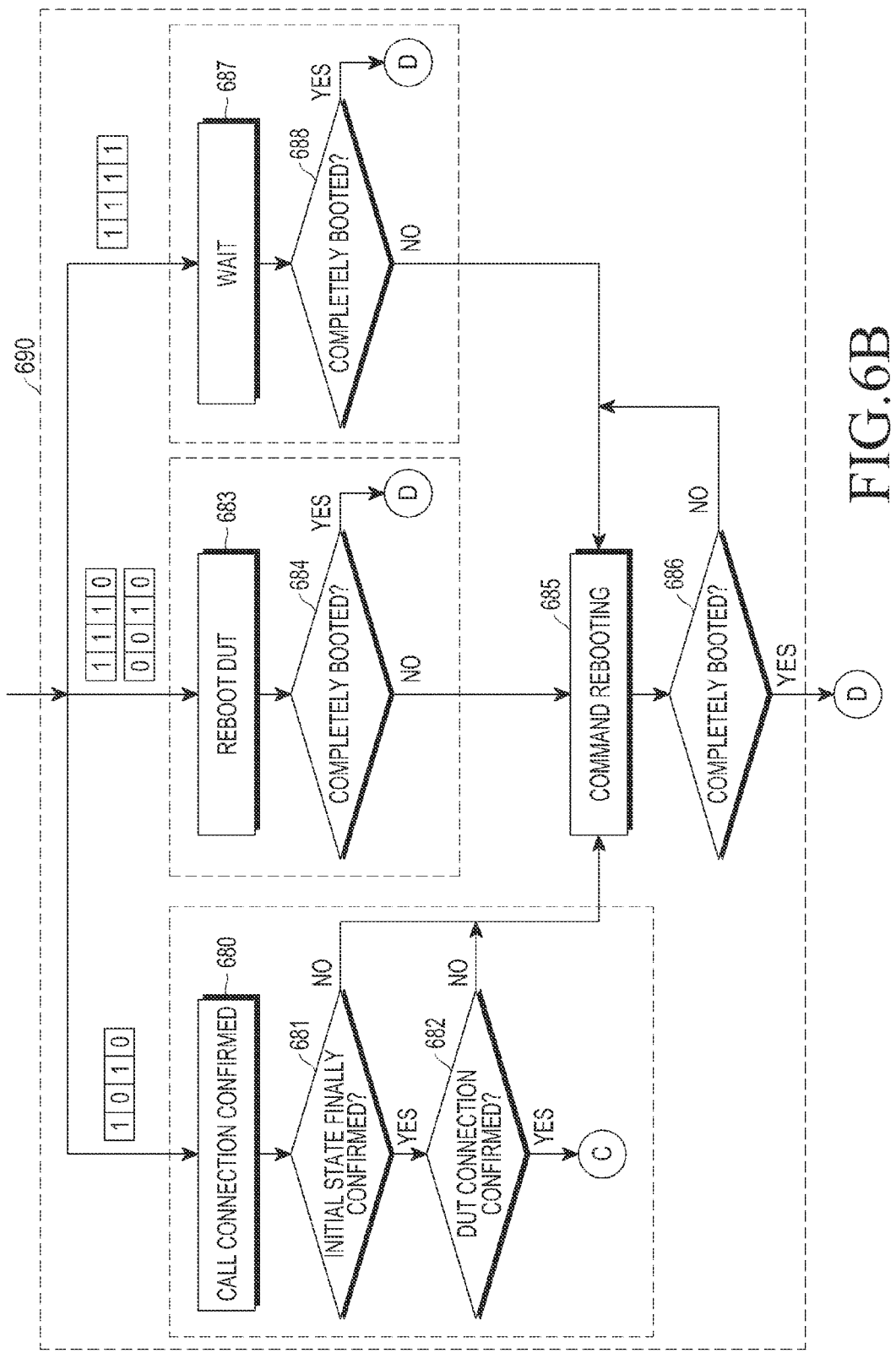

FIGS. 6A and 6B are flowcharts illustrating a control operation according to a malfunction type in a call mode according to a further exemplary embodiment of the present invention.

Referring to FIG. 6A, an operation based on a malfunction type in the call mode according to a third exemplary embodiment of the present invention will be described below.

Referring to FIG. 6A, steps 600 and 605 are performed in the same manner as steps 400 and 405 of FIG. 4A. Upon confirmation of connection to the DUT 100 in step 600, the ESD test equipment 110 confirms network registration of the DUT 100 through the call station 150 in step 610 and confirms a call connection in step 615. The subsequent steps 620 to 640 are performed in the same manner as steps 425 to 445 of FIG. 4A.

In accordance with the third exemplary embodiment of the present invention, if a test result at a current test position is a success, a current level of an applied voltage may be adjusted using the highest level, the lowest level, and the level control step set in step 305 of FIG. 3. To increase the accuracy of an ESD test, it is necessary to identify a voltage level that causes a test failure at the current test position, when electrostatic pulses are applied. Therefore, if an ESD test turns out a success when electromagnetic pulses are applied at the highest voltage level, the current voltage level may be adjusted by the level control step and then a voltage level that causes a failure at the test position may be detected.

Meanwhile, if the test result is a failure in step 630, the ESD test equipment 110 determines whether the DUT 100 has been disconnected from the network in step 645. If the DUT 100 is still connected to the network, the ESD test equipment 110 confirms the call connection again in step 650. Thereafter, the ESD test equipment 110 proceeds to step 655 in which the ESD test equipment 110 determines whether a DUT connection is confirmed. If the connection to the DUT 100 is confirmed in step 655, the ESD test equipment 110 goes to step 640 in order to continue the ESD test at the next test position. In contrast, if the connection to the DUT 100 is not confirmed, the ESD test equipment 110 commands rebooting to the DUT 100 in step 660.

In contrast, if the DUT 100 has been disconnected from the network in step 645, this may occur when the DUT 100 is reset and rebooted on its own. The DUT 100 may be disconnected from the network for a reason other than autonomous reset and rebooting of the DUT 100. Therefore, the ESD test equipment 110 determines whether a log has been received through the serial terminal 225 in step 665. If a log has not been received or if an 'ok' message is not received in response to an 'AT command' transmitted due to the absence of a log input, the ESD test equipment 110 commands rebooting to the DUT 100 in step 670. In contrast, if the DUT 100 reboots itself and thus the ESD test equipment 110 receives a log from the DUT 100 in step 665, the ESD test equipment 110 determines whether a 'booting completed' message has been received from the DUT 100 in step 675. If the DUT 100 has not been completely booted, the ESD test equipment 110 commands rebooting to the DUT 100 in step 660 and then proceeds to step 675. Upon completion of booting the DUT 100 in step 675, the ESD test equipment 110 returns to step 600 to thereby control retry of network registration and call connection of the DUT 100.

As in the MP3 mode, the ESD test equipment 110 may return the DUT 100 to the normal mode in regards to any malfunction, referring to a failure detection table for the call mode, such as, for example, Table 3 below.

TABLE 3

Fail Detection Table

| Call connection/ disconnection | Network registration/ deregistration | Current sensor | Serial terminal |
|---|---|---|---|
| 0/1 | 0/1 | 0/1 | 0/1 |

In Table 3, the call connection state sensor 220 outputs signals indicating whether a call has been connected to the DUT 100 and the DUT 100 has been registered to a network.

FIG. 6B is a detailed flowchart illustrating an operation 690 for controlling the DUT 100 according to a malfunction type detected in FIG. 6A, referring to Table 3.

Referring to Table 3, upon detection of '1010' through the call connection state sensor 220, the current sensor 215, and the serial terminal 225 of the failure detector 200 in step 630, the ESD test equipment 110 confirms a call connection to the DUT 100 in step 680, finally confirms the initial state of the DUT 100 in step 681, and confirms its connection to the DUT 100 in step 682. If these confirmations are not completed, the ESD test equipment 110 commands rebooting to the DUT 100 in step 685 and determines whether the DUT 100 has been completely booted in step 686. If the booting has not been completed, the ESD test equipment 110 commands rebooting to the DUT 100 in step 685.

Upon detection of '1110' or '0010' in step 630, the ESD test equipment 110 reboots the DUT 100 in step 683 and determines whether the DUT 100 has been completely booted in step 684. Upon detection of '1111' in step 630, the ESD test equipment 110 determines that the DUT 100 will be rebooted. Thus the ESD test equipment 110 waits a predetermined time in step 687 and then determines whether the DUT 100 has been completely booted in step 688. Upon completion of the booting, the ESD test equipment 110 returns to step 600 of FIG. 6A. If the booting is not completed, the ESD test equipment 110 proceeds to step 685 in which the ESD test equipment 110 commands rebooting.

As is apparent from the above description of exemplary embodiments of the present invention, an ESD test is performed on the DUT 100 in each mode in order to detect a malfunction type for each chip and detected malfunctions are recorded classified. Thus, an accurate ESD test result can be obtained. In addition, because the DUT 100 is automatically returned to normal mode according to a malfunction type without a user input, test efficiency is increased.

As exemplary embodiments of the present invention provide an unattended automated test system, labor cost is reduced and the efficiency of an automated DUT test is increased.

According to exemplary embodiments of the present invention, various malfunction types that can be generated during an ESD test of the DUT can be detected and even an ESD malfunction caused by a lockup which is elusive from a user can be detected. As a result, the accuracy of ESD performance evaluation can be increased.

Program instructions to perform a method described herein, or one or more operations thereof, may be recorded, stored, or fixed in one or more non-transient computer-readable storage media. The program instructions may be implemented by a computer. For example, the computer may cause a processor to execute the program instructions. The media may include, alone or in combination with the program instructions, data files, data structures, and the like. Examples of computer-readable media include magnetic media, such as hard disks, floppy disks, and magnetic tape; optical media such as CD ROM disks and DVDs; magneto-optical media, such as optical disks; and hardware devices that are specially configured to store and perform program instructions, such as read-only memory (ROM), random access memory (RAM), flash memory, and the like. Examples of program instructions include machine code, such as produced by a compiler, and files containing higher level code that may be executed by the computer using an interpreter. The program instructions, that is, software, may be distributed over network coupled computer systems so that the software is stored and executed in a distributed fashion. For example, the software and data may be stored by one or more computer readable recording mediums. Also, functional programs, codes, and code segments for accomplishing the example embodiments disclosed herein can be easily construed by programmers skilled in the art to which the embodiments pertain based on and using the flow diagrams and block diagrams of the figures and their corresponding descriptions as provided herein. Also, the described unit to perform an operation or a method may be hardware, software, or some combination of hardware and software. For example, the unit may be a software package running on a computer or the computer on which that software is running.

While the invention has been shown and described with reference to certain exemplary embodiments thereof, it will be understood by those skilled in the art that various changes in form and details may be made therein without departing from the spirit and scope of the invention as defined by the following claims and their equivalents.

What is claimed is:

1. An apparatus for automated testing of a Device Under Test (DUT), the apparatus comprising:
    a light sensor for detecting a display state change in the DUT;
    a microphone sensor for detecting a change in the level of a signal output from a speaker of the DUT;
    a current sensor for detecting a current state of the DUT;
    a serial terminal for connecting communication to the DUT; and
    a controller for transmitting a control command to the DUT through the serial terminal to return a test mode of the DUT to a normal mode according to a malfunction type that is detected by at least one of the light sensor, the microphone sensor, the current sensor, and the serial terminal when an electrostatic pulse is applied to the DUT.

2. The apparatus of claim 1, wherein the controller determines whether a response to the control command has been received from the DUT through the serial terminal, and if the response has not been received from the DUT, the controller reboots the DUT by operatively cutting off power to the DUT.

3. The apparatus of claim 1, further comprising a probe for applying the electrostatic pulse to a predetermined test area of the DUT to test electrostatic discharge of the DUT.

4. The apparatus of claim 1, wherein the test mode includes at least one of an MP3 mode, a camera mode, and a call mode.

5. The apparatus of claim 1, further comprising a call connection state sensor for detecting whether the DUT has been registered to a network and connected to a call.

6. The apparatus of claim 4, wherein when the test mode is the MP3 mode, the controller transmits a control command to return the test mode of the DUT to the normal mode according to a malfunction type detected by at least one of the light sensor, the microphone sensor, the current sensor, and the serial terminal, referring to a pre-stored failure detection table including malfunction types.

7. The apparatus of claim 5, wherein if the test mode is the call mode, the controller determines through the call connection state sensor whether the DUT has been registered to a network and connected to a call, determines whether a log has been received from the DUT if the DUT has been disconnected from the network, and determines whether a booting completed message has been received from the DUT if a log has been received from the DUT.

8. The apparatus of claim 7, wherein upon receipt of the booting completed message from the DUT, the controller transmits a connection confirm command to the DUT through the serial terminal, and confirms that the DUT has been registered to the network and connected to the call, upon receipt of a response message to the connection confirm message.

9. A method for automated testing of electrostatic discharge of a Device Under Test (DUT) in an automated test equipment, the method comprising:
applying an electrostatic pulse to the DUT;
detecting a malfunction type from the DUT; and
transmitting a control command to the DUT to return a test mode of the DUT to a normal mode according to the detected malfunction type.

10. The method of claim 9, further comprising:
determining whether a response to the control command has been received from the DUT through a serial terminal connecting the automated test equipment to the DUT; and
rebooting the DUT by cutting off power to the DUT, if the response to the control command has not been received from the DUT.

11. The method of claim 9, wherein the detecting of the malfunction type comprises detecting a malfunction in at least one of a display state of the DUT, the level of a signal output from a speaker of the DUT, and a current state of the DUT.

12. The method of claim 9, wherein the test mode includes at least one of an MP3 mode, a camera mode, and a call mode.

13. The method of claim 9, wherein the transmitting of the control command to the DUT comprises transmitting the control command to return the test mode of the DUT to the normal mode, referring to a prestored per-test mode failure detection table including malfunction types for the test mode.

14. The computer readable storage medium of claim 9, wherein the transmitting of the control command to the DUT comprises transmitting the control command to return the test mode of the DUT to the normal mode, referring to a prestored per-test mode failure detection table including malfunction types for the test mode.

15. A non-transient computer readable storage medium storing instructions that when executed cause at least one processor to perform a method for automated testing of electrostatic discharge of a Device Under Test (DUT) in an automated test equipment, the method comprising:
applying an electrostatic pulse to the DUT;
detecting a malfunction type from the DUT; and
transmitting a control command to the DUT to return a test mode of the DUT to a normal mode according to the detected malfunction type.

16. The computer readable storage medium of claim 15, wherein the method further comprises:
determining whether a response to the control command has been received from the DUT through a serial terminal connecting the automated test equipment to the DUT; and
rebooting the DUT by cutting off power to the DUT, if the response to the control command has not been received from the DUT.

17. The computer readable storage medium of claim 15, wherein the detecting of the malfunction type comprises detecting a malfunction in at least one of a display state of the DUT, the level of a signal output from a speaker of the DUT, and a current state of the DUT.

18. The computer readable storage medium of claim 15, wherein the test mode includes at least one of an MP3 mode, a camera mode, and a call mode.

* * * * *